(12) United States Patent
Kocer

(10) Patent No.: US 9,543,921 B2
(45) Date of Patent: Jan. 10, 2017

(54) APPARATUS AND METHODS FOR CONTROLLING OVERSHOOT IN DIGITAL STEP ATTENUATORS

(71) Applicant: Analog Devices Global, Hamilton (BM)

(72) Inventor: Fatih Kocer, Norwood, MA (US)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/724,731

(22) Filed: May 28, 2015

(65) Prior Publication Data

US 2016/0112026 A1    Apr. 21, 2016

Related U.S. Application Data

(60) Provisional application No. 62/064,424, filed on Oct. 15, 2014.

(51) Int. Cl.
*H03H 7/25* (2006.01)
*H03K 5/134* (2014.01)

(52) U.S. Cl.
CPC ............... *H03H 7/25* (2013.01); *H03K 5/134* (2014.07)

(58) Field of Classification Search
CPC ...................................................... H03H 7/25
USPC ....................................................... 333/81 R
See application file for complete search history.

(56) References Cited

U.S. PATENT DOCUMENTS

| 5,355,036 A | 10/1994 | Gata |
| 2006/0128334 A1 | 6/2006 | Ikuta et al. |
| 2010/0066427 A1 | 3/2010 | George |
| 2014/0002214 A1 | 1/2014 | Bawell et al. |
| 2015/0171828 A1 | 6/2015 | Lam |

FOREIGN PATENT DOCUMENTS

EP    0 753 937    1/1997

OTHER PUBLICATIONS

Extended European Search report mailed Mar. 7, 2016 in Application No. 15189791.5 (7 pages).

*Primary Examiner* — Stephen E Jones
*Assistant Examiner* — Scott S Outten
(74) *Attorney, Agent, or Firm* — Knobbe, Martens, Olson & Bear, LLP

(57) ABSTRACT

Apparatus and methods for controlling overshoot in digital step attenuators are disclosed. By configuring a multi-bit DSA such that an attenuation control block changes a plurality of control signals in a manner preventing a series cascade of attenuation units from having a transient attenuation value less than an initial and final value of attenuation, an overshoot condition can be prevented. Control signals transition the attenuation units to a first state of attenuation before they transition attenuation units to a second state of insertion.

20 Claims, 8 Drawing Sheets

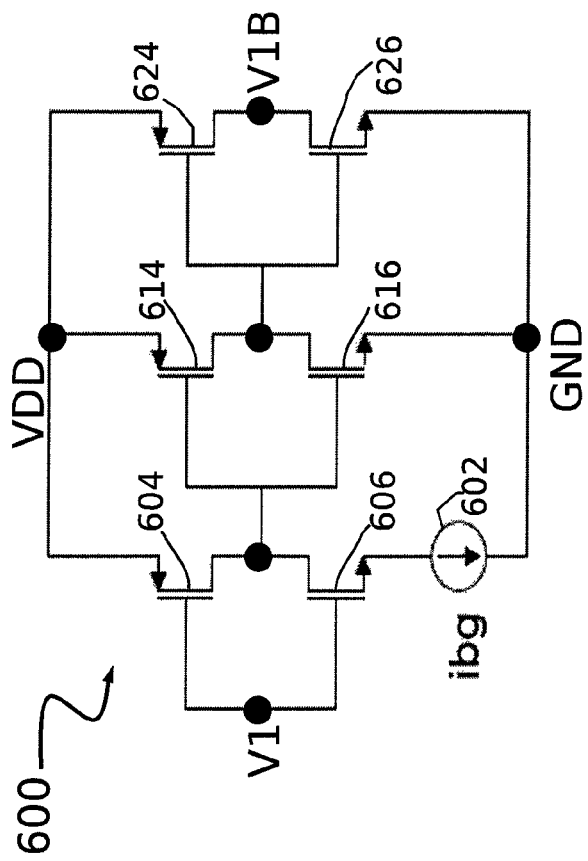
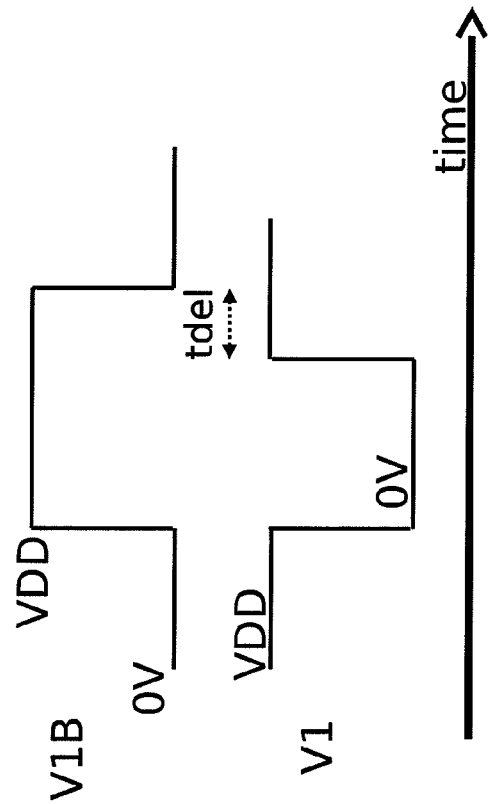
FIG. 6

APPARATUS AND METHODS FOR CONTROLLING OVERSHOOT IN DIGITAL STEP ATTENUATORS

The present application claims priority to U.S. Provisional Patent Application No. 62/064,424, filed Oct. 15, 2014, titled "APPARATUS AND METHODS FOR CONTROLLING OVERSHOOT IN DIGITAL STEP ATTENUATORS," the entirety of which is hereby incorporated herein by reference.

BACKGROUND

Field

Embodiments of the invention relate to electronic systems, and more particularly, to digital step attenuators.

Description of the Related Technology

Digital step attenuators (DSA) frequently include attenuator units and switches to selectively adjust the attenuation level. A control unit can provide control signals to control the state of the switches, on state or off state, which in turn control the state of the attenuator units, insertion state or attenuation state.

In one example, a control unit provides control signals to change the state of switches of a DSA to increase the impedance and thereby increase the total attenuation.

In another example, a control unit provides control signals to change the state of switches of a DSA to decrease the impedance and thereby decrease the total attenuation.

SUMMARY

In one embodiment an attenuator component includes a plurality of attenuator units each having an attenuation value that define a range of attenuation values, wherein some of the attenuation values comprise higher attenuation values and some of the attenuation values comprise lower attenuation values. The plurality of attenuator units are coupled together so as to receive an input and an output signal that has a final attenuation value; and each of the plurality of attenuator units has a first state where a first attenuation value is applied to an input signal to produce a first output, and a second state where a second attenuation value is applied to an input signal to produce a second output, wherein the first attenuation value is greater than the second attenuation value.

The attenuator component further includes a control unit that in response to a logic signal selecting a final attenuation value, provides control signals to the plurality of attenuation units so that the plurality of attenuation units are placed into either the first state or the second state. The control unit induces selected ones of the plurality of attenuation units having higher attenuation values to enter the second state after selected ones of the plurality of attenuation units having lower attenuation values enter the first state so as to reduce transient overshoot provided at the output during transition of the attenuator component from one attenuation level to another.

According to some embodiments, the first state comprises attenuation and the second state comprises insertion.

In another embodiment the control units switch the attenuation units of the plurality of attenuation units that are switching from the first state to the second state after switching the attenuation units of the plurality of attenuation units that are switching from the second state to the first state so as to reduce transient overshoot at the output during transitions between attenuation levels.

The attenuator component can comprise a plurality of attenuation units having attenuation networks, wherein the plurality of attenuation units further comprises a first switch and a second switch electrically connected to the attenuation network; and wherein the first switch, the second switch, and the attenuation network are electrically connected between a first unit terminal and a second unit terminal so as to provide a resistance between the first unit terminal and the second unit terminal.

In another embodiment the control unit provides control signals to control the first and second switches so that in the first state the first switch is open and the second switch is closed so as to have a first resistance between the first unit terminal and the second unit terminal. The control unit also provides control signals to control the first and second switches so that in the second state the first switch is closed and the second switch is open so as to have a second resistance between the first unit terminal and the second unit terminal, wherein the first resistance is greater than the second resistance.

According to some embodiments, the control unit provides controls signals to effect a change so that the first switch transitions from open to closed slower than it transitions from closed to open.

In another embodiment the control unit comprises a delay circuit to provide a first control signal to the first switch so as to delay the transition from open to closed relative to the transition from closed to open.

The control unit can provide controls signals to effect a change so that the second switch transitions from closed to open when the first switch transitions from open to closed and so that the second switch transitions from open to closed when the first switch transitions from closed to open.

In one aspect of this disclosure a method of operating a plurality of attenuator units each having an attenuation value that define a range of attenuation values, wherein some of the attenuation values comprise higher attenuation values and some of the attenuation values comprise lower attenuation values is provided. The plurality of attenuator units are coupled together so as to receive an input and an output signal that has a final attenuation value. The method includes providing an input signal to the plurality of attenuator units. The method includes operating the plurality of attenuator units in a first state where a first attenuation value is applied to an input signal to produce a first output, and a second state where a second attenuation value is applied to an input signal to produce a second output. In addition the first attenuation value is greater than the second attenuation value.

The method further includes receiving a logic signal selecting a final attenuation value in response to the logic signal providing control signals to the plurality of attenuation units so that the plurality of attenuation units are placed into either the first state or the second state. The method also includes controlling selected ones of the plurality of attenuation units having higher attenuation values to enter the second state after selected ones of the plurality of attenuation units having lower attenuation values enter the first state so as to reduce transient overshoot of an output signal during transition of the attenuator component from one attenuation level to another. And the method includes providing control signals to switch the attenuation units of the plurality of attenuation units that are switching from the second state to the first state before switching the attenuation units of the plurality of attenuation units that are switching from the first state to the second state.

In another aspect, a method comprises controlling the first and second switches so that in the first state the first switch is open and the second switch is closed so as to have a first resistance between the first unit terminal and the second unit terminal. The method further comprises controlling the first and second switches so that in the second state the first switch is closed and the second switch is open so as to have a second resistance between the first unit terminal and the second unit terminal; and wherein the first resistance is greater than the second resistance.

In another embodiment, a method comprises controlling the first switch to transition from open to closed slower than it transitions from closed to open, and comprises providing a first control signal to the first switch using a delay circuit so as to delay the transition from open to closed of the first switch relative to the transition from closed to open of the first switch. The method can further comprise providing a second control signal to the second switch controlling the second switch to transition from closed to open when the first switch transitions from open to closed so that the second switch transitions from open to closed when the first switch transitions from closed to open.

BRIEF DESCRIPTION OF THE DRAWINGS

FIG. 6 is a schematic diagram with waveform outputs of a delay circuit according to another embodiment of the invention.

DETAILED DESCRIPTION OF EMBODIMENTS

Figure 1:
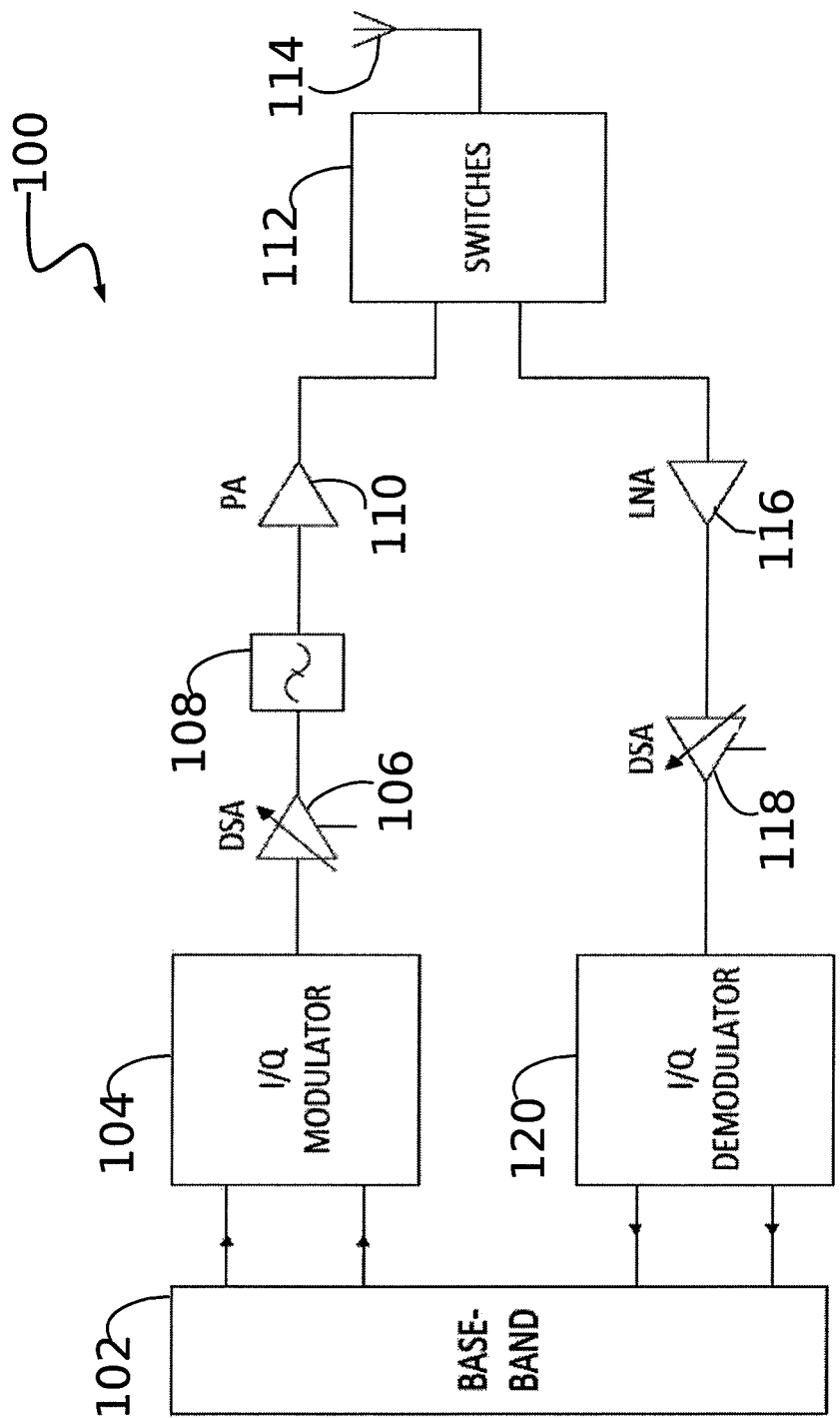
FIG. 1 is a system level diagram of an RF system including digital switched attenuators (DSAs).

The following detailed description of embodiments presents various descriptions of specific embodiments of the invention. However, the invention can be embodied in a multitude of different ways as defined and covered by the claims. In this description, reference is made to the drawings where like reference numerals may indicate identical or functionally similar elements.

A digital step attenuator (DSA) can have a series cascaded array of attenuation units each providing a linear amount of attenuation expressed in decibels (dB) and each contributing to the total attenuation of the series array. The attenuation units can each include series and shunt switches with an attenuation network, such as hybrid-T networks, and the switches can either electrically couple the attenuation network to contribute to the total attenuation in an attenuation state or electrically bypass the attenuation network to not contribute in an insertion state. In addition, each attenuation unit can have a binary weighted bit of attenuation such as 8 dB, 4 dB, 2 dB, and 1 dB. In this manner each attenuation unit can also be referred to as an attenuation bit.

The series and shunt switches of an attenuation unit can receive control signals to control the state, insertion or attenuation, of the attenuation unit. For instance, it can be desirable to increase or decrease the amount of attenuation based upon an RF signal's power level. The DSA can attenuate an RF signal to protect RF components such as low-noise or power amplifiers. In these cases the DSA, placed before the sensitive RF components in the signal path, can protect the sensitive component by attenuating the power of the RF signal to a safe level.

However, when more than one attenuation unit changes state, there is a transition period during which the total attenuation of the DSA can change in an unpredictable manner; when the total attenuation during the transient, referred to as transient attenuation, becomes lower than the final attenuation value following the transient, then an RF signal can undergo a transient overshoot. The transient overshoot can cause an RF signal at the output of the attenuator to momentarily exceed a safe power level of an input component at the output of the attenuator and to potentially damage circuit components.

Accordingly, limitations in the control of DSA switches can lead to transient overshoot causing circuit component damage which can be unacceptable for RF systems.

Provided herein are apparatus and methods for controlling overshoot in digital step attenuators (DSAs). In certain configurations, overshoot can be prevented by first switching DSA units in a state of insertion to a state of attenuation. This causes the transient attenuation to take on a maximum value before DSA units in a state of attenuation are switched to a state of insertion. In this transient control approach, overshoot is prevented by forcing undershoot.

FIG. 1 is a system level diagram of an RF system 100 including digital switched attenuators (DSAs). Baseband I/Q signals derived from the baseband system block 102 are modulated within the I/Q modulator block 104 and follow a forward signal path through a digital step attenuator (DSA) 106, a filter 108, a power amplifier (PA) 110 into a switches block 112. The switches block 112 can pass the signal to the RF antenna 114.

In FIG. 1 the switches block 112 can also pass a received RF signal from antenna 114 along the return signal path through the low noise amplifier 116, the DSA 118, and into the I/Q demodulator 120, which provides demodulated I/Q signals to the baseband system block 102.

The digital step attenuators DSA 106 and DSA 118 can receive control signals to change the amount of attenuation in the forward and return signal paths. Both DSA 106 and DSA 118 can include attenuation units, also referred to as attenuation bits, which receive control signals to control the amount of attenuation in the signal path. For instance, the forward path DSA 106 can attenuate signals from the I/Q modulator block 104 before they reach the filter 108 so as to protect input components of both the filter 108 and power amplifier (PA) 110. Similarly, the return path DSA 118 can attenuate the output signals from the LNA 116 so as to protect sensitive components within the I/Q demodulator 120.

Figure 2A:
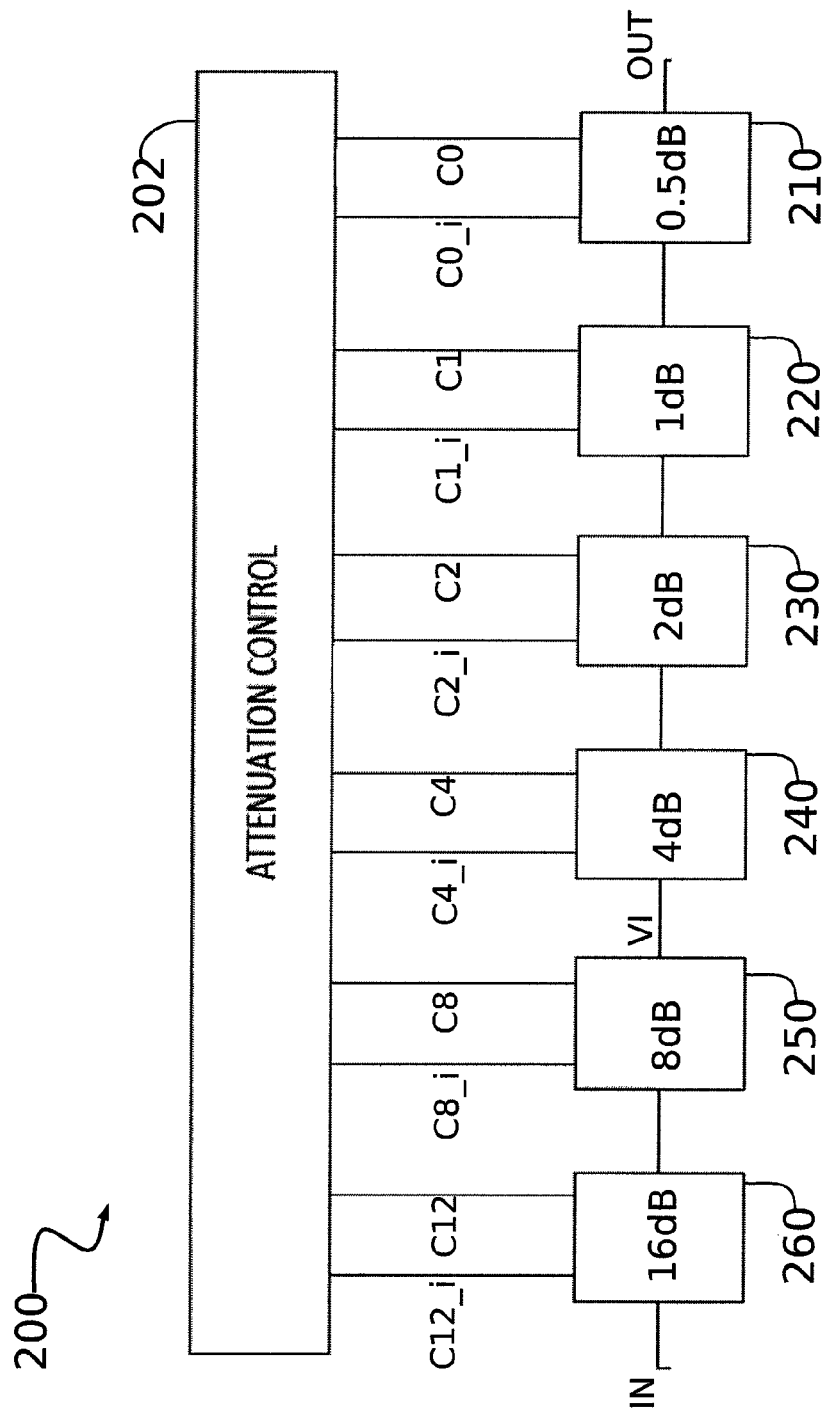
FIG. 2A is a schematic diagram of a multi-bit DSA system according to one embodiment of the invention.

FIG. 2A is a schematic diagram of a multi-bit DSA system 200 according to one embodiment of the invention. The multi-bit DSA system 200 includes six series connected attenuation units, also referred to as bits: a 0.5 dB unit 210, a 1 dB unit 220, a 2 dB unit 230, a 4 dB unit 240, an 8 dB unit 250, and a 16 dB unit 260. The six attenuation units are series connected to form a cascade between the input (IN) and output (OUT) with an input terminal of the 16 dB unit 260 operating as the input (IN) of the DSA and an output terminal of the 0.5 dB unit operating as the output (OUT). The cascade series connection between the input (IN) and output (OUT) is further detailed as follows: an output terminal of the 16 dB unit 260 is electrically connected to an input terminal of the 8 dB unit 250; an output terminal of the 8 dB unit 250 is electrically connected to an input terminal of the 4 dB unit 240; an output terminal of the 4 dB unit 240 is electrically connected to an input terminal of the 2 dB unit 230; an output terminal of the 2 dB unit 230 is electrically connected to an input terminal of the 1 dB unit 220; and an output terminal of the 1 dB unit 220 is electrically connected to an input terminal of the 0.5 dB unit 210.

The multi-bit DSA system 200 also includes an attenuation control block 202 to provide a plurality of control signals: control signals C0 and C0_$i$ to the 0.5 dB unit 210; C1 and C1_$i$ to the 1 dB unit 220; C2 and C2_$i$ to the 2 dB unit 230; C4 and C4_$i$ to the 4 dB unit 240; C8 and C8_$i$ to the 8 dB unit 250; C12 and C12_$i$ to the 16 dB unit 260.

The series cascade of attenuation units 210-260 can attenuate an RF signal received at the input (IN) of the 16 dB unit 260 and transmitted at the output (OUT) of the 0.5 dB unit 210. The amount of attenuation can be determined by a state of each of the attenuation units 210-260. In particular, each of the attenuation units 210-260 can have one of two states: a first state where an attenuation unit attenuates an RF signal, and a second state where an attenuation unit electrically passes an RF signal. Also, the first state can also be referred to as an attenuation state, while the second state can be referred to as an insertion state or insertion.

In the configuration illustrated in FIG. 2, the attenuation control block 202 can further provide the plurality of control signals such that each of the attenuation units 210-260 operates in either its first or second state. In this manner the attenuation control block 202 with the series cascade of attenuation units 210-260 can provide an amount of attenuation in decibels (dB). For example, an amount of attenuation totaling 30 dB can be possible with the following configuration: C12 and C12_$i$ control the 16 dB unit 260 to operate in its first state; C8 and C8_$i$ control the second unit 250 to operate in its first state; C4 and C4_$i$ control the 4 dB unit 240 to operate in its first state; C2 and C2_$i$ control the 2 dB unit 230 to operate in its first state; C1 and C1_$i$ control the 1 dB unit 220 to operate in its second state; and C0 and C0_$i$ control the 0.5 dB unit 210 to operate in its second state.

The attenuation control block 202 can also change one or more of the plurality of control signals such that an amount of attenuation of the series cascade of attenuation units 210-260 changes an initial value in dB to a final value in dB. For instance, the attenuation control block 202 can provide and change one or more of the plurality of control signals to change the total amount of attenuation from an initial value of 30 dB to a final value of 25.5 dB as follows: changing C4 and C4_$i$ to transition the 4 dB unit 240 from operating in its first state to operating in its second state; changing C2 and C2_$i$ to transition the 2 dB unit 230 from operating in its first state to operating in its second state; changing C1 and C1_$i$ to transition the 1 dB unit 220 from operating in its second state to operating in its first state; and changing C0 and C0_$i$ to transition the 0.5 dB unit 210 from operating in its second state to operating in its first state.

During the transition time, also known as transient time, from when the attenuation control block 202 initiates a change in one or more of the plurality of control signals to when the attenuation control block 202 completes the change, the DSA multi-bit system 200 can undergo a transient change. During the transient change, the total attenuation can vary and can have values not equal to the initial attenuation or the final attenuation. For instance, in the above configured example where the series cascade of the multi-bit DSA 200 has an initial attenuation value of 30 dB and a final attenuation value of 25.5 dB, the control signals can be configured such that the transient attenuation takes on one of the following intermediate values: a transient attenuation value less than the initial and final values; a transient value greater than the initial and final values; or a transient value between the initial and final values. For instance, in the above example if the attenuation control block 202 changes the plurality of control signals such that both the 4 dB unit 240 and the 2 dB unit 230 change to their second states before the 1 dB unit 220 and 0.5 dB unit 210 change to their first states, then the transient attenuation value can take on an intermediate value of 24 dB thereby causing a potentially system-damaging RF signal overshoot. On the other hand, if the attenuation control block 202 changes the plurality of control signals such that both the 4 dB unit 240 and the 2 dB unit 230 change to their second states after the 1 dB unit 220 and 0.5 dB unit 210 change to their first states, then the transient attenuation value can take on an intermediate value of 31.5 dB thereby causing undershoot. When the multi-bit DSA system 200 receives an RF signal at the input (IN) such that a transient value of attenuation causes the RF signal output (OUT) to have undershoot, then the system is protected.

Figure 2B:
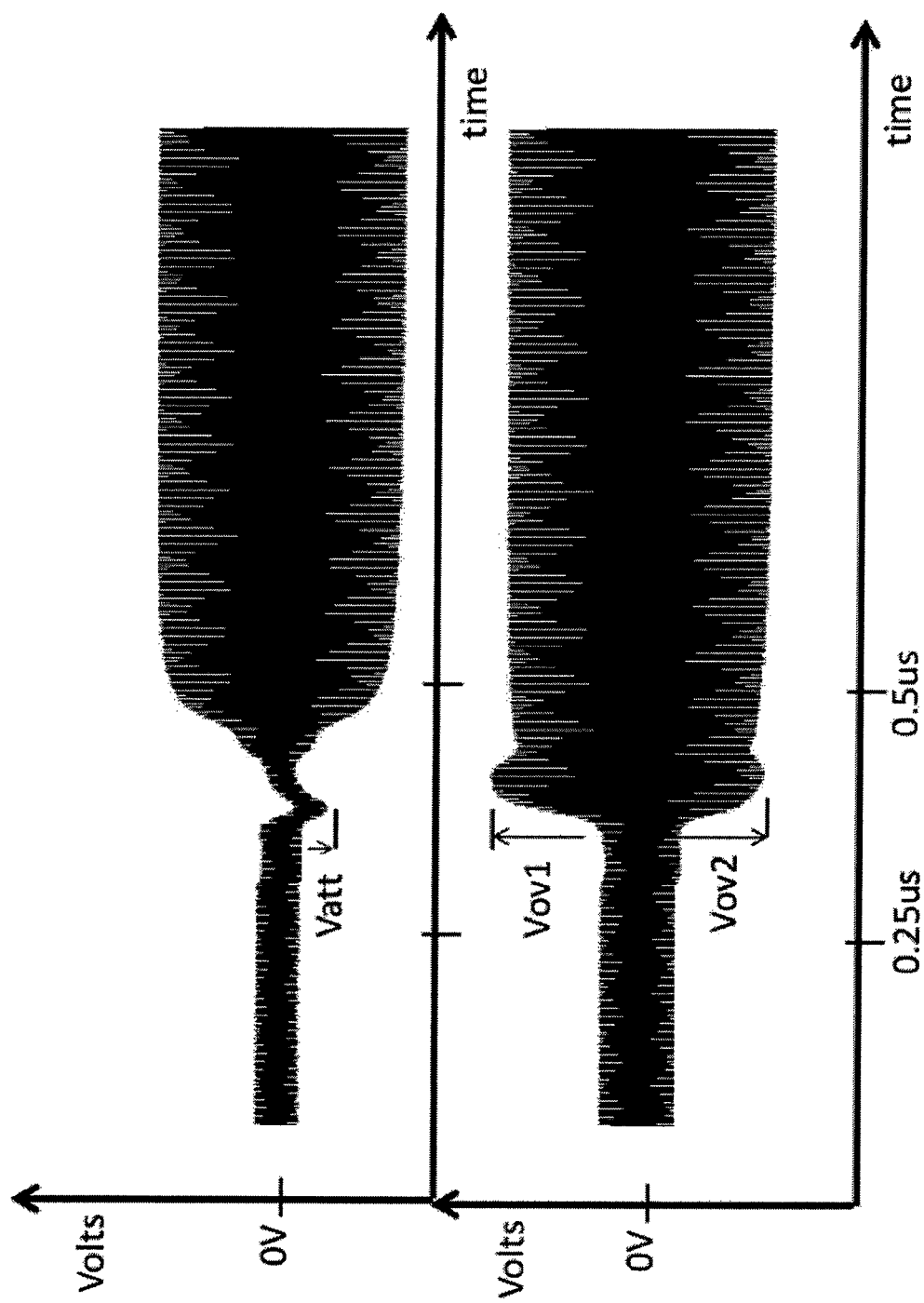
FIG. 2B shows the output waveforms of an RF signal having the desired undershoot in one embodiment of the invention compared to an RF signal having overshoot.

FIG. 2B shows the output waveforms of an RF signal having a desired undershoot in one embodiment of the invention compared to an RF signal having overshoot. FIG. 2B further illustrates overshoot and undershoot phenomenon in an RF signal of a multi-bit DSA during a transition period from 0.25 us to 0.5 us during which a multi-bit DSA transitions from having an initial attenuation value before 0.25 us lower than a final value after 0.5 us. In the top waveform, the multi-bit DSA is configured such that during the transient period from 0.25 us to 0.5 us the transient attenuation is greater than either the initial or final attenuations. In this manner an RF signal can undershoot as depicted by the voltage label Vatt. In the bottom waveform by comparison, the multi-bit DSA is configured such that the transient attenuation is less than either the initial or final attenuations. In this manner an RF signal output undergoes overshoot as depicted by the voltage labels Vov1 and Vov2.

While FIG. 2A shows one configuration for a multi-bit DSA 202, other configurations are possible and should be common knowledge to those skilled in the art of digital step attenuators and RF systems. For instance, there can be greater or fewer attenuation units cascaded in series within the series cascade; in addition, the attenuation units can have other values such as 0.25 dB, and the attenuation control block 202 with the series cascade of attenuation units 210-260 can provide greater or fewer control signals. In teaching the methods and apparatus for controlling overshoot, a smaller portion of FIG. 2A treating the 0.5 dB unit 210, 1 dB unit 220, 2 dB unit 230, and the 4 dB unit 240 can be considered without loss of generality by taking the signal input as VI drawn at the input of the 4 dB unit 240.

Figure 3:
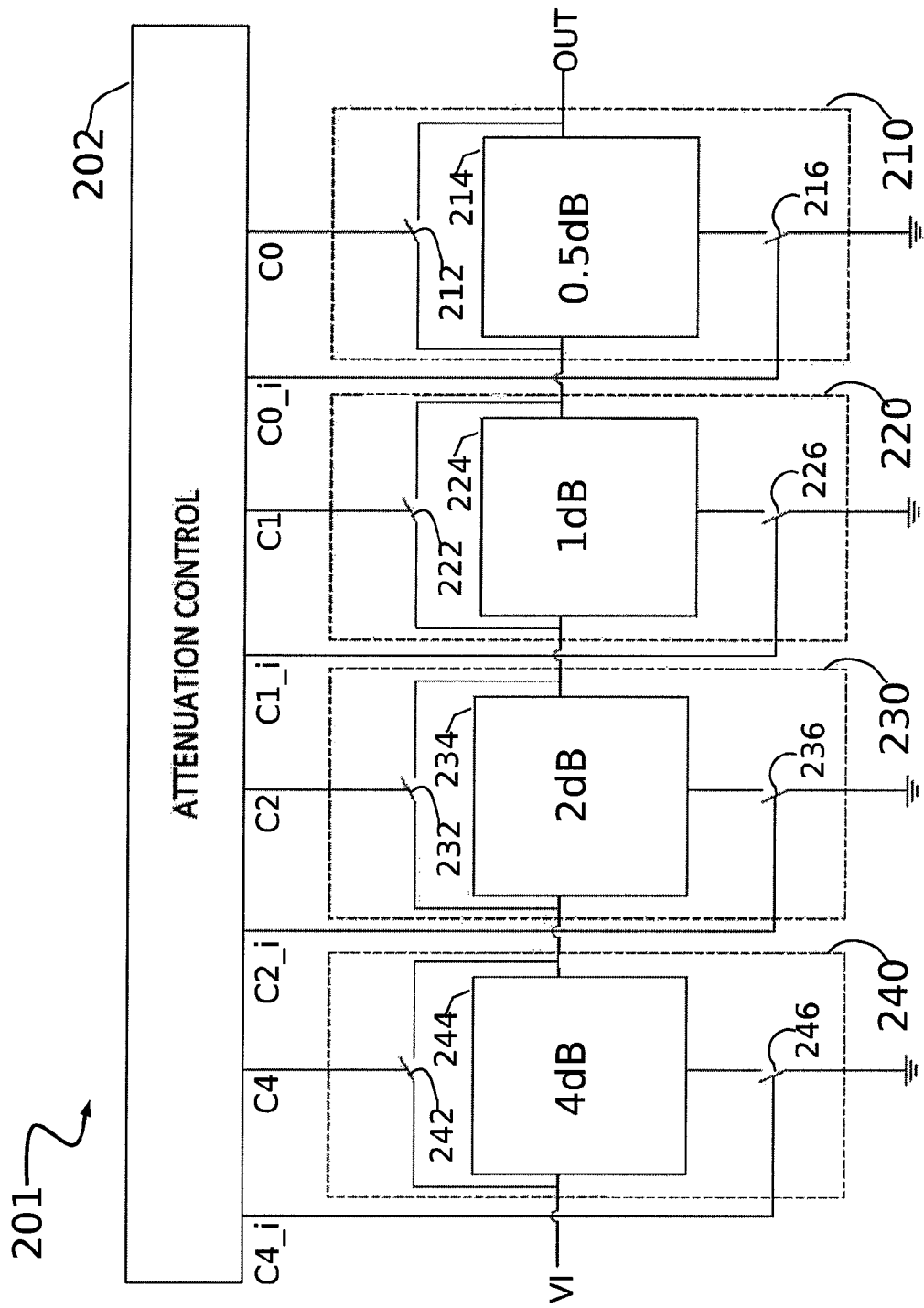
FIG. 3 is a schematic diagram of a four-bit DSA system according to another embodiment of the invention.

FIG. 3 is a schematic diagram of showing a four-bit DSA 201 from the multi-bit DSA system 200 according to another embodiment of the invention. In this configuration the multi-bit DSA system 200 can be configured such that an RF signal VI is received at the input of the 4 dB unit 240. FIG. 3 further details each attenuation unit 210-240. The 0.5 dB unit 210 includes a first unit terminal and a second unit terminal. The 0.5 dB unit 210 also includes an attenuation network 214 which can provide 0.5 dB of attenuation and which has a first network terminal electrically connected to the first unit terminal of the 0.5 dB unit 210, a second network terminal electrically connected to the second unit terminal of the 0.5 dB unit 210, and a third network terminal. The 0.5 dB unit 210 includes a first switch 212 having a first switch terminal electrically connected to the second unit terminal of the 0.5 dB unit 210, a second switch terminal electrically connected to the first unit terminal of the 0.5 dB unit 210, and a control terminal configured to receive the control signal C0 from the attenuation control block 202. The 0.5 dB unit 210 also includes a second switch 216 having a first switch terminal electrically connected to the third network terminal of the attenuation network 214, a second switch terminal electrically connected to ground, and a control terminal configured to receive the control signal C0_i from the attenuation control block 202.

The 0.5 dB unit 210 can receive control signals C0 and C0_i such that in the first state the second switch 216 is closed and electrically couples the third network terminal of the attenuation network 214 to ground while the first switch 212 is open and does not electrically couple the first and second unit terminals of the 0.5 dB unit 210. In this way the attenuation network 214 can provide 0.5 dB of attenuation between the first and second unit terminals of the 0.5 dB unit 210. In the second state the second switch 216 is open and does not electrically couple the third network terminal of the attenuation network 214 to ground while the first switch 212 is closed and electrically couples the first and second unit terminals of the 0.5 dB unit 210. In this way the first switch 212 can pass an RF signal such that it is not attenuated by the attenuation network 214. In this configuration the second state of the 0.5 dB unit 210 is an insertion state.

The 1 dB unit 220 includes a first unit terminal and a second unit terminal. The 1 dB unit 220 also includes an attenuation network 224 which can provide 1.0 dB of attenuation and which has a first network terminal electrically connected to the first unit terminal of the 1 dB unit 220, a second network terminal electrically connected to the second unit terminal of the 1 dB unit 220, and a third network terminal. The 1 dB unit 220 includes a first switch 222 having a first switch terminal electrically connected to the second unit terminal of the 1 dB unit 220, a second switch terminal electrically connected to the first unit terminal of the 1 dB unit 220, and a control terminal configured to receive the control signal C1 from the attenuation control block 202. The 1 dB unit 220 also includes a second switch 226 having a first switch terminal electrically connected to the third network terminal of the attenuation network 224, a second switch terminal electrically connected to ground, and a control terminal configured to receive the control signal C1_i from the attenuation control block 202.

The 1 dB unit 220 can receive control signals C1 and C1_i such that in the first state the second switch 226 is closed and electrically couples the third network terminal of the attenuation network 224 to ground while the first switch 222 is open and does not electrically couple the first and second unit terminals of the 1 dB unit 220. In this way the attenuation network 224 can provide 1.0 dB of attenuation between the first and second unit terminals of the 1 dB unit 220. In the second state the second switch 226 is open and does not electrically couple the third network terminal of the attenuation network 224 to ground while the first switch 222 is closed and electrically couples the first and second unit terminals of the 1 dB unit 220. In this way the first switch 222 can pass an RF signal such that it is not attenuated by the attenuation network 224. In this configuration the second state of the 1 dB unit 220 is an insertion state.

The 2 dB unit 230 includes a first unit terminal and a second unit terminal. The 2 dB unit 230 also includes an attenuation network 234 which can provide 2.0 dB of attenuation and which has a first network terminal electrically connected to the first unit terminal of the 2 dB unit 230, a second network terminal electrically connected to the second unit terminal of the 2 dB unit 230, and a third network terminal. The 2 dB unit 230 includes a first switch 232 having a first switch terminal electrically connected to the second unit terminal of the 2 dB unit 230, a second switch terminal electrically connected to the first unit terminal of the 2 dB unit 230, and a control terminal configured to receive the control signal C2 from the attenuation control block 202. The 2 dB unit 230 also includes a second switch 236 having a first switch terminal electrically connected to the third network terminal of the attenuation network 234, a second switch terminal electrically connected to ground, and a control terminal configured to receive the control signal C2_i from the attenuation control block 202.

The 2 dB unit 230 can receive control signals C2 and C2_i such that in the first state the second switch 236 is closed and electrically couples the third network terminal of the attenuation network 234 to ground while the first switch 232 is open and does not electrically couple the first and second unit terminals of the 2 dB unit 230. In this way the attenuation network 234 can provide 2.0 dB of attenuation between the first and second unit terminals of the 2 dB unit 230. In the second state the second switch 236 is open and does not electrically couple the third network terminal of the attenuation network 234 to ground while the first switch 232 is closed and electrically couples the first and second unit terminals of the 2 dB unit 230. In this way the first switch 232 can pass an RF signal such that it is not attenuated by the attenuation network 234. In this configuration the second state of the 2 dB unit 230 is an insertion state.

The 4 dB unit 240 includes a first unit terminal and a second unit terminal. The 4 dB unit 240 also includes an attenuation network 244 which can provide 4.0 dB of attenuation and which has a first network terminal electrically connected to the first unit terminal of the 4 dB unit 240, a second network terminal electrically connected to the second unit terminal of the 4 dB unit 240, and a third network terminal. The 4 dB unit 240 includes a first switch 242 having a first switch terminal electrically connected to the second unit terminal of the 4 dB unit 240, a second switch terminal electrically connected to the first unit terminal of the 4 dB unit 240, and a control terminal configured to receive the control signal C4 from the attenuation control block 202. The 4 dB unit 240 also includes a second switch 246 having a first switch terminal electrically connected to the third network terminal of the attenuation network 244, a second switch terminal electrically connected to ground, and a control terminal configured to receive the control signal C4_i from the attenuation control block 202.

The 4 dB unit 240 can receive control signals C4 and C4_i such that in the first state the second switch 246 is closed and electrically couples the third network terminal of the attenuation network 244 to ground while the first switch 242 is open and does not electrically couple the first and second unit terminals of the 4 dB unit 240. In this way the attenuation network 244 can provide 4.0 dB of attenuation between the first and second unit terminals of the 4 dB unit 240. In the second state the second switch 246 is open and does not electrically couple the third network terminal of the attenuation network 244 to ground while the first switch 242 is closed and electrically couples the first and second unit terminals of the 4 dB unit 240. In this way the first switch 242 can pass an RF signal such that it is not attenuated by the attenuation network 244. In this configuration the second state of the 4 dB unit 240 is an insertion state.

Figure 4:
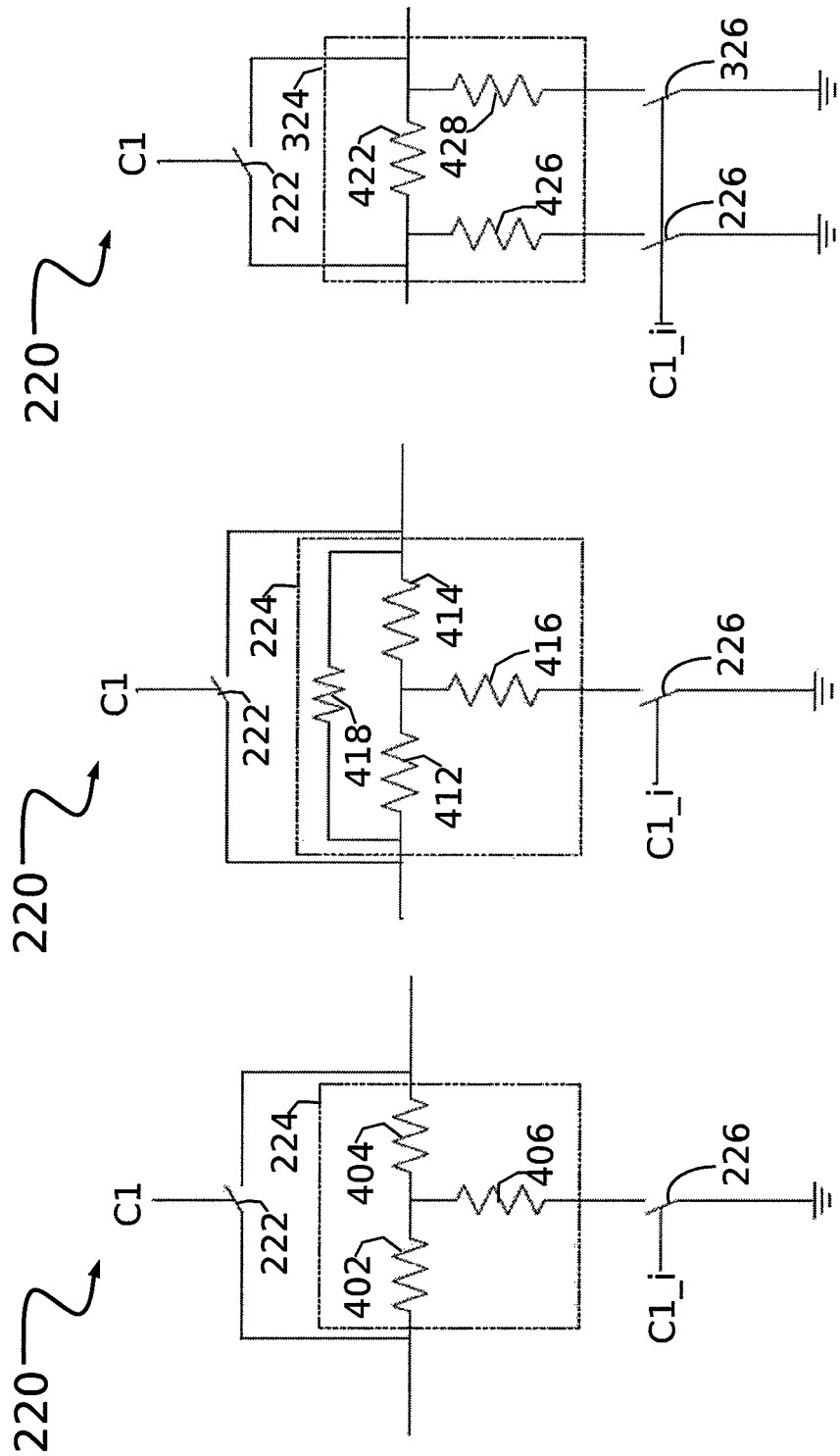
FIG. 4A is a schematic diagram of an attenuation unit for realizing a DSA bit according to one embodiment of the invention.
FIG. 4B is a schematic diagram of an attenuation unit for realizing a DSA bit according to another embodiment of the invention.
FIG. 4C is a schematic diagram of an attenuation unit for realizing a DSA bit according to another embodiment of the invention.

FIG. 4A is a schematic diagram of the 1 dB unit 220 for realizing a DSA bit according to one embodiment of the invention. The attenuation network 224 includes a first resistor 402 electrically connected between the first network terminal of the attenuation network 224 and a center terminal, a second resistor 404 electrically connected between the second network terminal of the attenuation network 224 and the center terminal, and a third resistor 406 electrically connected between the center tap and the third network terminal of the attenuation network 224. The first-third resistors 402-406 form a T-type network and can attenuate an RF signal between the first and the second network terminals of the attenuation network 224. In particular to the 1 dB unit 220, the resistors can attenuate an RF signal in the amount of 1 dB and can be balanced to known impedance. While this schematic provides general circuit detail without specifying resistor values to one embodiment of the attenuation network 224, this schematic can also apply to the construction of the attenuation networks of each of the attenuation units 210-260. Furthermore, the construction of attenuation networks should be common knowledge to those skilled in the art of RF systems having digital step attenuators.

FIG. 4B is a schematic diagram of the 1 dB unit 220 for realizing a DSA bit according to another embodiment of the invention. The attenuation network 224 includes a first resistor 412 electrically connected between the first network terminal of the attenuation network 224 and a center terminal, a second resistor 414 electrically connected between the second network terminal of the attenuation network 224 and the center terminal, a third resistor 416 electrically connected between the center tap and the third network terminal of the attenuation network 224, and a fourth resistor 418 electrically connected between the first and second network terminals of the attenuation network 224. The first-fourth resistors 412-418 form a hybrid-T network and can attenuate an RF signal between the first and the second network terminals of the attenuation network 224. In particular to the 1 dB unit 220, the resistors can attenuate an RF signal in the amount of 1 dB and can be balanced to known impedance. While this schematic provides general circuit detail without specifying resistor values to one embodiment of the attenuation network 224, this schematic can also apply to the construction of the attenuation networks of each of the attenuation units 210-260. Furthermore, the construction of attenuation networks should be common knowledge to those skilled in the art of RF systems having digital step attenuators.

FIG. 4C is a schematic diagram of the 1 dB unit 220 for realizing a DSA bit according to another embodiment of the invention having an attenuation network 324. Similar to the attenuation network 224, the attenuation network 324 includes a first network terminal electrically connected to the first unit terminal of the 1 dB unit 220, a second network terminal electrically connected to the second unit terminal of the 1 dB unit 220, and a third network terminal electrically connected to the first switch terminal of the second switch 226. In contrast to the attenuation network 224, the attenuation network 324 further includes a fourth network terminal which is electrically connected to a first switch terminal of a third switch 326 of the 1 dB unit 220. The second switch terminal of the third switch 326 is electrically connected to ground. The attenuation network 324 further includes a first resistor 422 electrically connected between the first and second network terminals of the attenuation network 324, a second resistor 426 electrically connected between the first and third network terminals of the attenuation network 324, and a third resistor 428 electrically connected between the second and fourth network terminals of the attenuation network 324. The first-third resistors 422-428 form a pi-type network and can attenuate an RF signal between the first and the second network terminals of the attenuation network 324. In particular to the 1 dB unit 220, the resistors can attenuate an RF signal in the amount of 1 dB and can be balanced to known impedance. Also, the third switch 326 further includes a control terminal configured to receive the control signal C1_$i$.

As illustrated in the configuration of FIG. 4C the third switch 326 of the 1 dB unit 220 can operate in parallel with the second switch 226 of the 1 dB unit 220. Furthermore, the operation of the 1 dB unit 220 of FIG. 4C in the first and second state can be equivalent to the operation of the 1 dB unit 220 of previous figures and reference can be made to the discussions for the previous figures. Also, while this schematic provides general circuit detail without specifying resistor values to one embodiment of the attenuation network 324, this schematic can also apply to the construction of the attenuation networks of each of the attenuation units 210-260. Furthermore, the construction of attenuation networks should be common knowledge to those skilled in the art of RF systems having digital step attenuators.

Figure 5:
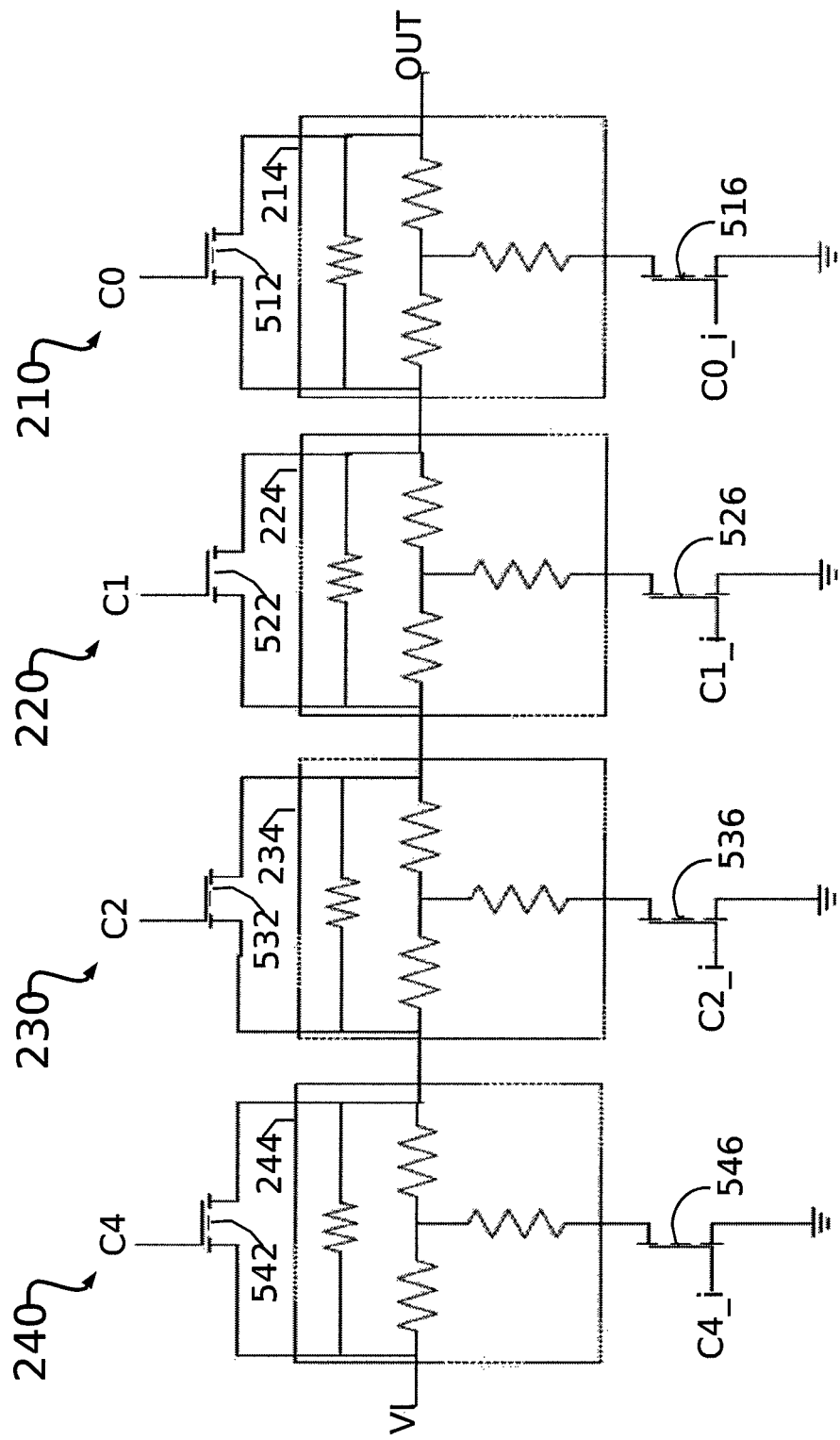
FIG. 5 is a schematic diagram of a four-bit DSA system using FETs according to another embodiment of the invention.

FIG. 5 is a schematic diagram of the four-bit DSA system 201 using FETs as switches according to another embodiment of the invention. In the illustrated configuration the 0.5 dB unit 210 includes the following: a first FET 512 having a drain connected to the second unit terminal of the 0.5 dB unit 210, a source connected to the first unit terminal of the 0.5 dB unit 210, and a gate configured to receive the control signal C0; and a second FET 516 having a drain connected to the third unit terminal of the 0.5 dB unit 210, a source connected to ground, and a gate configured to receive the control signal C0_$i$. The 1 dB unit 220 includes the following: a first FET 522 having a drain connected to the second unit terminal of the 1 dB unit 220, a source connected to the first unit terminal of the 1 dB unit 220, and a gate configured to receive the control signal C1; and a second FET 526 having a drain connected to the third unit terminal of the 1 dB unit 220, a source connected to ground, and a gate configured to receive the control signal C1_$i$. The 2 dB unit 230 includes the following: a first FET 532 having a drain connected to the second unit terminal of the 2 dB unit 230, a source connected to the first unit terminal of the 2 dB unit 230, and a gate configured to receive the control signal C2; and a second FET 536 having a drain connected to the third unit terminal of the 2 dB unit 230, a source connected to ground, and a gate configured to receive the control signal C2_$i$. The 4 dB unit 240 includes the following: a first FET 542 having a drain connected to the second unit terminal of the 4 dB unit 240, a source connected to the first unit terminal of the 4 dB unit 240, and a gate configured to receive the control signal C4; and a second FET 546 having a drain connected to the third unit terminal of the 4 dB unit 240, a source connected to ground, and a gate configured to receive the control signal C4_i.

The 0.5 dB unit 210 can receive control the signals C1 and C1_i such that in the first state the second FET 516 operates with low drain-to-source impedance so as to electrically couple the third network terminal of the attenuation network 214 to ground while the first FET 512 operates with high drain-to-source impedance so as to not electrically couple the first and second unit terminals of the 0.5 dB unit 210. In this way the attenuation network 214 can provide 0.5 dB of attenuation between the first and second unit terminals of the 0.5 dB unit 214. In the second state the second FET 516 operates with high drain-to-source impedance so as to not electrically couple the third network terminal of the attenuation network 214 to ground while the first FET 512 operates with low drain-to-source impedance so as to electrically couple the first and second unit terminals of the 0.5 dB unit 210. In this way the first FET 512 can pass an RF signal such that it is not attenuated by the attenuation network 214. In this configuration the second state of the 0.5 dB unit 210 is an insertion state.

The 1 dB unit 220, the 2 dB unit 230, and the 4 dB unit 240 can also receive control signals to operate in the first and second states in a manner similar to that described above for the 0.5 dB unit 210. Similar to the discussion above, control signals C1 and C1_i can control the first and second FETs 522 and 526 to place the 1 dB unit 220 into either its first or second state. Also, control signals C2 and C2_i can control the first and second FETs 532 and 536 to place the 2 dB unit 230 into its first or second state. Likewise, control signals C4 and C4_i can control the first and second FETs 542 and 546 to place the 4 dB unit 240 into its first or second state.

In FIG. 5 each of the FETs 512-546 can be either N-channel or P-channel and the control signals C0, C0_i, C1, C1_i, C2, C2_i, C4, C4_i can be voltage signals. For instance, when the first and second FETs 512 and 516 of the 0.5 dB unit 210 are N-channel FETs, then the 0.5 dB unit 210 can receive the control signals C1 and C1_i as voltages. In this configuration in the first state the second FET 516 can operate with low drain-to-source impedance when control signal C1_i provides a high voltage, greater than 0V or a FET threshold voltage, to the gate of the second FET 516 so as to electrically couple the third network terminal of the attenuation network 214 to ground; while the first FET 512 can operate with high drain-to-source impedance when control signal C1 provides a low voltage, less than a FET threshold voltage, to the gate of the first FET 512 so as to not electrically couple the first and second unit terminals of the 0.5 dB unit 210. Other configurations and control signals appropriate to DSAs using N-channel and P-channel FETs operating in a first and second state should be well understood to those skilled in the art.

FIG. 6 is a schematic diagram with output waveforms of a delay circuit 600 according to another embodiment of the invention. The delay circuit 600 can provide the plurality of control signals to the plurality of attenuation units 210-240 so as to control overshoot as discussed with respect to FIGS. 2A and 2B. The delay circuit consists of three inverter stages. The first stage includes the following: a first NFET 606 having a gate, a source, and a drain; a first PFET 604 having a gate electrically connected to the gate of the first NFET 606, a source electrically connected to a supply voltage VDD, and a drain electrically connected to the drain of the first NFET 606; and a current source 602 electrically connected between ground and the source of the of the first NFET 606. The second stage includes the following: a second NFET 616 having a gate, a source electrically connected to ground, and a drain; and a second PFET 614 having a gate electrically connected to the gate of the second NFET 616, a source electrically connected to the supply voltage VDD, and a drain electrically connected to the drain of the second NFET 616. The third stage includes the following: a third NFET 626 having a gate, a source electrically connected to ground, and a drain; and a third PFET 624 having a gate electrically connected to the gate of the third NFET 626, a source electrically connected to the supply voltage VDD, and a drain electrically connected to the drain of the third NFET 626. The three stages are cascaded such that the first stage can receive an input voltage V1 at the gate of the first NFET 606, while the third stage can provide a delayed output voltage V1B at the output of the third NFET 626. The second stage is electrically connected in the cascade between the first and second stages such that the gate of the second NFET 616 is electrically connected to the drain of the first NFET 606 and such that the gate of the third NFET 626 is electrically connected to the drain of the second NFET 616.

The current source 602 can adjust the amount of time delay tdel between the input signal V1 and the output signal V1B as shown in the two waveforms of FIG. 6. As shown in FIG. 6, the delay circuit 600 can operate such that when the input signal transitions from a high voltage VDD (supply) to a low voltage (0V), then the output signal V1B can change from a low voltage to a high voltage with little or no delay time. Also, as shown in FIG. 6, the delay circuit can operate such that when the input signal V1 transitions from a low voltage to a high voltage, the output signal V1B can change from a high voltage to a low voltage after a measured time delay tdel.

A plurality of delay circuits similar to the delay circuit 600 can create the plurality of control signals C0, C0_i, C1, C1_i, C2, C2_i, C4, and C4_i to control overshoot of an RF signal of the multi-bit DSA 200 of FIG. 5. For example, when each of the FETs 512-546 are N-channel FETs, the output waveform can be used to provide a make-before-break transition: each FET can switch from having high drain-to-source impedance to having low drain-to-source impedance after a delay time tdel, while each FET can switch from having low drain-to-source impedance to having high drain-to-source impedance with little or no delay. By way of example, a first delay circuit similar to that of FIG. 6 can provide an output C0_i while an additional inverter can invert the signal to provide C0. Similarly, second-fourth delay circuits similar to that of FIG. 6 can further provide outputs C1_i, C2_i, and C4_i while additional inverters can invert C1_i, C2_i, and C4_i to provide C1, C2, and C4, respectively. When one or more of the attenuation units of the four-bit DSA 201 changes from a first state to a second state then the first N-channel FET of the one or more attenuation units can change from having high source-to-drain impedance to having low drain-to-source impedance after the delay time tdel. At the same time when one or more of the attenuation units of the four-bit DSA 201 changes from a second state to a first state, then the first N-channel FET of the one or more attenuation units can change from having a low drain-to-source impedance to having a high drain-to-source impedance with little or no delay. In this manner the attenuation units 210-240 of the four-bit DSA 201 can operate such that during a transition from a first or second state to a second or first state, the transition time from the first state to the second state is delayed by an amount tdel compared to the transition time from second state to the first state. Therefore, the total transient attenuation can be greater than or equal to the total attenuation before and after the transition by virtue of the delay signal.

Figure 7:
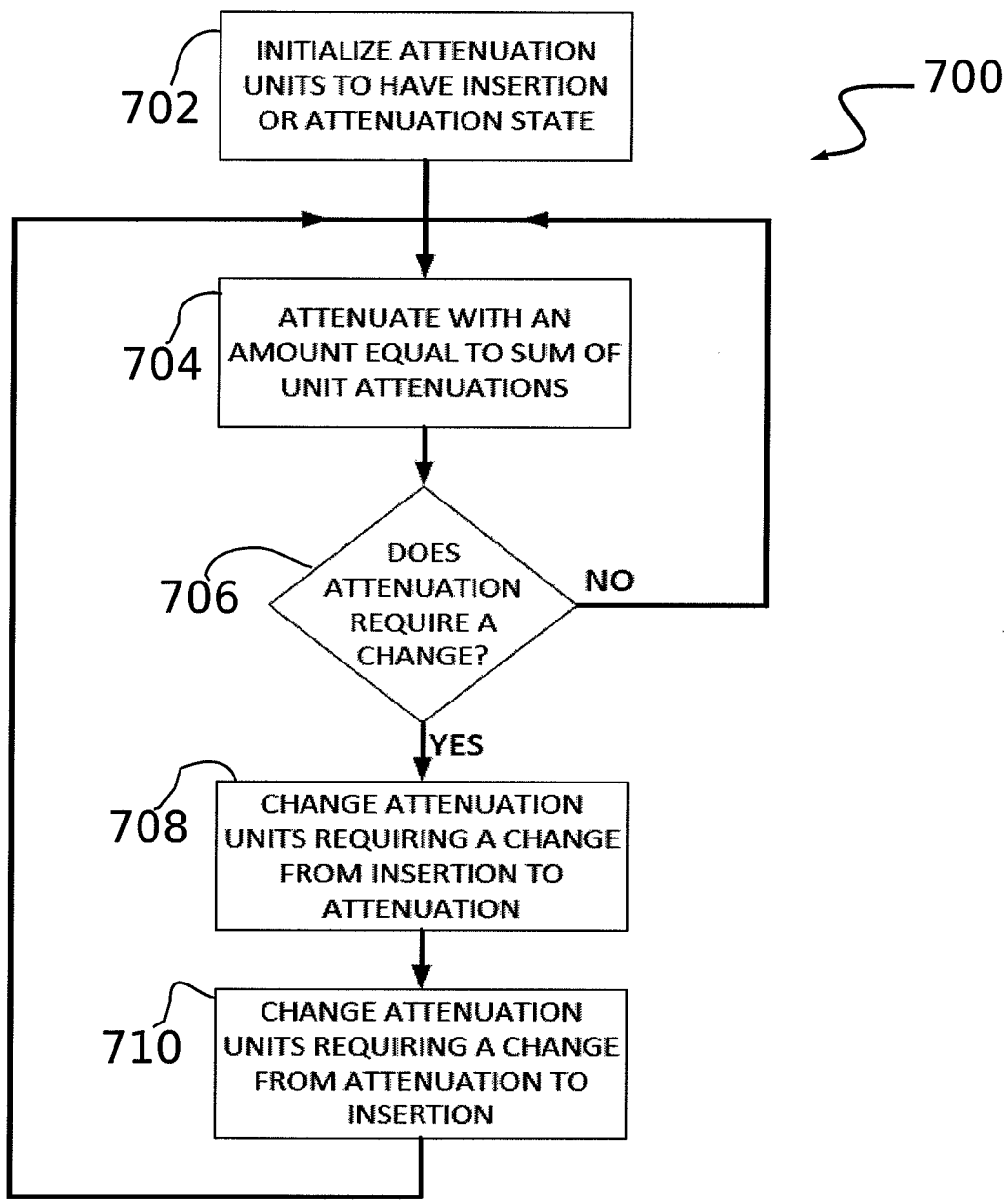
FIG. 7 is a flow diagram of a multi-bit DSA system control method according to one embodiment of the invention.

FIG. 7 is a flow diagram of a multi-bit DSA system control method 700 according to one embodiment of the invention. In the control method 700, the system is initialized in an initialization step 702 with each attenuation unit (bit) receiving initial control signals to determine the initial operating state. Following the initialization step 702 is an operation step 704 during which the system operates in a stable state as an attenuator with a controlled amount of attenuation determined by the sum of the units (bits). A decision block 706 can represent the onset of a change or transition. Decision block 706 can observe if the multi-bit DSA system requires a change to operate with a new attenuation value. If the system does not require a change, then the system returns to operation step 704. However, if the system does require a change, then the flow of operation continues to a first transition step 708: control signals can change the state of each attenuation unit requiring a change from insertion state to attenuation state. Only the units requiring the change from insertion state to attenuation state occur during the first transition step 708, then the following step is a second transition step 710: control signals can change the state of each attenuation unit requiring a change from attenuation state to insertion state.

The multi-bit DSA system control method 700 of FIG. 7 conceptually applies to the method and apparatus teachings herein. For instance, each of the attenuation units 210-240 of FIG. 5 can be controlled by a delay circuit similar to the delay circuit 600 shown in FIG. 6 in a manner consistent with the flow operations of the multi-bit DSA control method 700. Consider for instance the operation of the 1 dB unit 220 of FIG. 5 in connection to the multi-bit DSA control method 700. The delay circuit 600 can provide the control signal C1_i using the waveform V1B while also providing an additional signal C1, derived from the logical inverse of V1B. When the first and second FETs 522 and 526 are N-channel FETs, the 1 dB unit 220 operates in its first state (attenuation) when V1 of the delay circuit 600 is low and operates in its second state (insertion) when V1 is high. It also follows, that when V1 changes from low to high, C1 and C1_i change after a time delay tdel to change the state to the second state, insertion; further, when V1 changes from high to low, C1 and C1_i change with little or no time delay compared to tdel to change the state to the first state, attenuation.

When each of the attenuation units 210-240 are controlled by a delay circuit similar to the delay circuit 600 in the same manner, then the first and second transition steps 708 and 710 happen by design: attenuation units changing from the second state (insertion) to the first state (attenuation) change before attenuation units changing from the first state to the second state. In connection with controlling overshoot as depicted in the top waveform of FIG. 2B, the multi-bit DSA system control method 700 transitions from the decision block 706 to the second transition step 710 so that attenuation is always largest during the transient. Transition step 708 increasing attenuation occurs before transition step 710 decreasing attenuation. Therefore, the total attenuation can be greatest during the transient time interval as manifested in the undershoot waveform shown in FIG. 2B.

Although the delay circuit 600 of FIG. 6 with the four-bit DSA of FIG. 5 can provide one system for implementing the flow process of the multi-bit DSA system control method 700, other systems are possible. For instance, a multi-bit DSA can be controlled by a DSP to effect the flow operations of the multi-bit DSA system control method 700. Or the operations can be implemented in a system using other types of digital delay circuits instead of the delay circuit 600.

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An attenuator component comprising:
a plurality of attenuator units each having an attenuation value that define a range of attenuation values, wherein some of the attenuation values comprise higher attenuation values and some of the attenuation values comprise lower attenuation values, wherein the plurality of attenuator units are coupled together so as to receive an input and an output signal that has a final attenuation value, and wherein each of the plurality of attenuator units has a first state where a first attenuation value is applied to an input signal to produce a first output, and a second state where a second attenuation value is applied to an input signal to produce a second output, wherein the first attenuation value is greater than the second attenuation value;
a control unit that in response to a logic signal selecting a final attenuation value, provides control signals to the plurality of attenuation units so that the plurality of attenuation units are placed into either the first state or the second state, wherein the control unit induces selected ones of the plurality of attenuation units having higher attenuation values to enter the second state after selected ones of the plurality of attenuation units having lower attenuation values enter the first state so as to reduce transient overshoot provided at the output during transition of the attenuator component from one attenuation level to another; and wherein the control signals comprise a first control signal and a first inverted control signal and the control unit comprises a delay circuit, the delay circuit having at least two inverter stages connected in a cascade, wherein the delay circuit is configured to receive the first control signal at an input of the cascade and to provide the first inverted control signal at an output of the cascade, wherein the first control signal and the first inverted control signal are provided to a select one of the plurality of attenuation units so as to cause the select one of the plurality of attenuation units to transition from the second state to the first state faster than the select one of the plurality of attenuation units transitions from the first state to the second state.

2. The component of claim 1, wherein the plurality of attenuator units comprises an attenuation network selected from the group consisting of T-type networks, hybrid-T networks, and pi-type networks.

3. The component of claim 2,
wherein the plurality of attenuation units further comprises a first switch and a second switch electrically connected to the attenuation network; and
wherein the first switch, the second switch, and the attenuation network are electrically connected between a first unit terminal and a second unit terminal so as to provide a resistance between the first unit terminal and the second unit terminal.

4. The component of claim 3,
wherein the control unit provides control signals to control the first and second switches so that in the first state the first switch is open and the second switch is closed so as to have a first resistance between the first unit terminal and the second unit terminal;
wherein the control unit provides control signals to control the first and second switches so that in the second state the first switch is closed and the second switch is open so as to have a second resistance between the first unit terminal and the second unit terminal; and
wherein the first resistance is greater than the second resistance.

5. The component of claim 4, wherein the control unit provides controls signals to effect a change so that the first switch transitions from open to closed slower than it transitions from closed to open.

6. The component of claim 5, wherein the control unit comprises a delay circuit to provide a first control signal to the first switch so as to delay the transition from open to closed relative to the transition from closed to open.

7. The component of claim 6, wherein the control unit provides controls signals to effect a change so that the second switch transitions from closed to open when the first switch transitions from open to closed and so that the second switch transitions from open to closed when the first switch transitions from closed to open.

8. The component of claim 7, wherein the switches comprise field effect transistors.

9. The component of claim 1, wherein the first state comprises attenuation and the second state comprises insertion.

10. The component of claim 1, wherein the control unit switches the attenuation units of the plurality of attenuation units that are switching from the first state to the second state after switching the attenuation units of the plurality of attenuation units that are switching from the second state to the first state so as to reduce transient overshoot at the output during transitions between attenuation levels.

11. The component of claim 1, wherein the attenuation values include 4 dB, 2 dB, 1 dB and 0.5 dB and wherein the higher attenuation values comprise 4 dB and 2 dB.

12. A method comprising:
operating a plurality of attenuator units each having an attenuation value that define a range of attenuation values, wherein some of the attenuation values comprise higher attenuation values and some of the attenuation values comprise lower attenuation values, wherein the plurality of attenuator units are coupled together so as to receive an input and an output signal that has a final attenuation value;
providing an input signal to the plurality of attenuator units;
operating the plurality of attenuator units in a first state where a first attenuation value is applied to an input signal to produce a first output, and a second state where a second attenuation value is applied to an input signal to produce a second output, wherein the first attenuation value is greater than the second attenuation value;
receiving a logic signal selecting a final attenuation value;
in response to the logic signal providing control signals to the plurality of attenuation units so that the plurality of attenuation units are placed into either the first state or the second state;
controlling selected ones of the plurality of attenuation units having higher attenuation values to enter the second state after selected ones of the plurality of attenuation units having lower attenuation values enter the first state so as to reduce transient overshoot of an output signal during transition of the attenuator component from one attenuation level to another; and
providing a first control signal and a first inverted control signal from a delay circuit having at least two inverters to a select one of the plurality of attenuation units so as to cause the select one of the plurality of attenuation units to transition from the second state to the first state faster than the select one of the plurality of attenuation units transitions from the first state to the second state.

13. The method of claim 12, wherein the plurality of attenuator units comprises an attenuation network selected from the group consisting of T-type networks, hybrid-T networks, and pi-type networks.

14. The method of claim 13,
wherein the plurality of attenuation units further comprises a first switch and a second switch electrically connected to the attenuation network; and
wherein the first switch, the second switch, and the attenuation network are electrically connected between a first unit terminal and a second unit terminal so as to provide a resistance between the first unit terminal and the second unit terminal.

15. The method of claim 14, further comprising:
controlling the first and second switches so that in the first state the first switch is open and the second switch is closed so as to have a first resistance between the first unit terminal and the second unit terminal;
controlling the first and second switches so that in the second state the first switch is closed and the second switch is open so as to have a second resistance between the first unit terminal and the second unit terminal; and wherein the first resistance is greater than the second resistance.

16. The method of claim 15, further comprising:
controlling the first switch to transition from open to closed slower than it transitions from closed to open.

17. The method of claim 16, further comprising:
providing a first control signal to the first switch using a delay circuit so as to delay the transition from open to closed of the first switch relative to the transition from closed to open of the first switch.

18. The method of claim 17, further comprising:
providing a second control signal to the second switch controlling the second switch to transition from closed to open when the first switch transitions from open to closed and so that the second switch transitions from open to closed when the first switch transitions from closed to open.

19. The method of claim 12, wherein the first state comprises attenuation and the second state comprises insertion.

20. The method of claim 12, further comprising:
providing control signals to switch the attenuation units of the plurality of attenuation units that are switching from the second state to the first state before switching the attenuation units of the plurality of attenuation units that are switching from the first state to the second state.

* * * * *